United States Patent
Pujari

(10) Patent No.: US 9,590,532 B2
(45) Date of Patent: Mar. 7, 2017

(54) POWERPAD

(71) Applicant: Swarnav Pujari, Yorktown Heights, NY (US)

(72) Inventor: Swarnav Pujari, Yorktown Heights, NY (US)

(*) Notice: Subject to any disclaimer, the term of this patent is extended or adjusted under 35 U.S.C. 154(b) by 145 days.

(21) Appl. No.: 14/616,666

(22) Filed: Feb. 7, 2015

(65) Prior Publication Data

US 2016/0233794 A1   Aug. 11, 2016

(51) Int. Cl.
*H02N 2/18* (2006.01)
*H02N 2/00* (2006.01)
*H01L 41/113* (2006.01)
*H02N 1/04* (2006.01)

(52) U.S. Cl.
CPC ............ *H02N 2/18* (2013.01); *H01L 41/113* (2013.01); *H02N 1/04* (2013.01); *H02N 2/22* (2013.01)

(58) Field of Classification Search
CPC ... H02N 2/18; H02N 1/04; H02N 2/22; H01L 41/113
See application file for complete search history.

(56) References Cited

U.S. PATENT DOCUMENTS

| | | | | |
|---|---|---|---|---|
| 6,550,639 B2* | 4/2003 | Brown | ............... | A47L 13/40 15/1.52 |
| 8,613,182 B2* | 12/2013 | D'Agostino | ............ | E04F 15/08 52/309.12 |
| 9,178,446 B2* | 11/2015 | Wang | ................. | H02N 1/04 |
| 9,394,875 B2* | 7/2016 | Wang | ................. | F03B 13/14 |
| 2013/0334930 A1* | 12/2013 | Kang | ................ | H01L 41/113 310/339 |
| 2014/0292138 A1* | 10/2014 | Wang | ................. | H02N 1/04 310/300 |
| 2015/0061460 A1* | 3/2015 | Bae | ................... | H02N 1/04 310/310 |
| 2015/0061464 A1* | 3/2015 | Park | ................. | H01L 41/113 310/329 |
| 2015/0224324 A1* | 8/2015 | Lee | ................... | A61N 1/3785 156/249 |
| 2016/0065091 A1* | 3/2016 | Wang | ................. | H02N 1/04 310/300 |

\* cited by examiner

*Primary Examiner* — Michael Zarroli
(74) *Attorney, Agent, or Firm* — Howard Eichenblatt

(57) ABSTRACT

A method of fabricating a large-scale triboelectric nanogenerator by adhering foil to two separate plates, laying polymer to the foil, heating the plates, and then electrically coupling one of the plates.

8 Claims, 2 Drawing Sheets

POWERPAD

BACKGROUND

In recent years, much effort has been applied to developing the structure and application of nanogenerators. Nanogenerators, of which there are several categories, harvest mechanical energy in the environment, and accordingly have provided new power sources for devices. However, current nanogenerators tend to be small scale (less than XXXX inches squared per unit), even though fabricating large scale units should theoretically reduce costs and increase overall output. Accordingly, this invention seeks to provide a method of fabricating larger scale nanogenerators.

SUMMARY

Aspects of the present invention include: a method of fabricating a large-scale triboelectric nano-generator, a method of fabricating a large scale piezoelectric nanogenerator, and a method of placing either or both kinds of nano-generators in a single housing.

DETAILED DESCRIPTION

In one embodiment, the device comprises a triboelectric nano-generator or TENG. An exemplary fabrication of a large-scale TENG is as follows.

Figure 1:
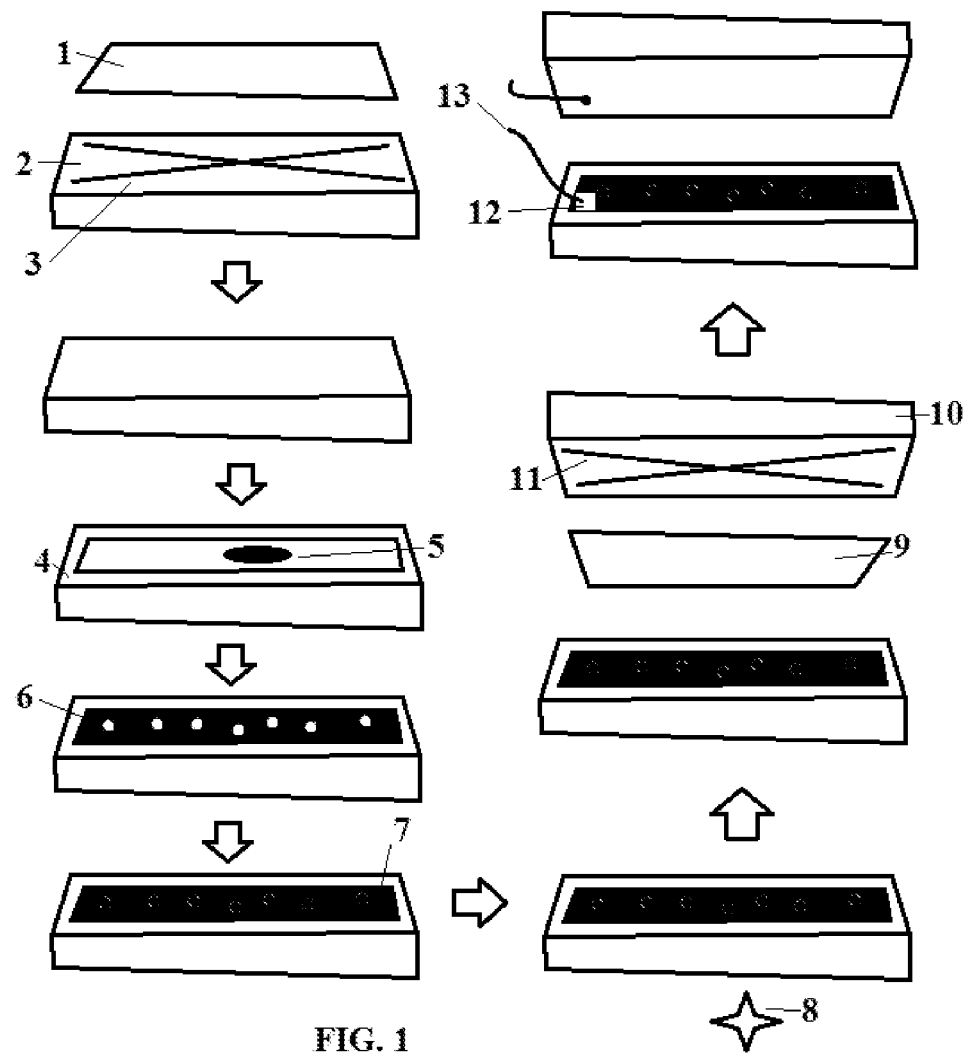
FIG. 1 features a graphic flowchart of one or more embodiments.
Figure 2:
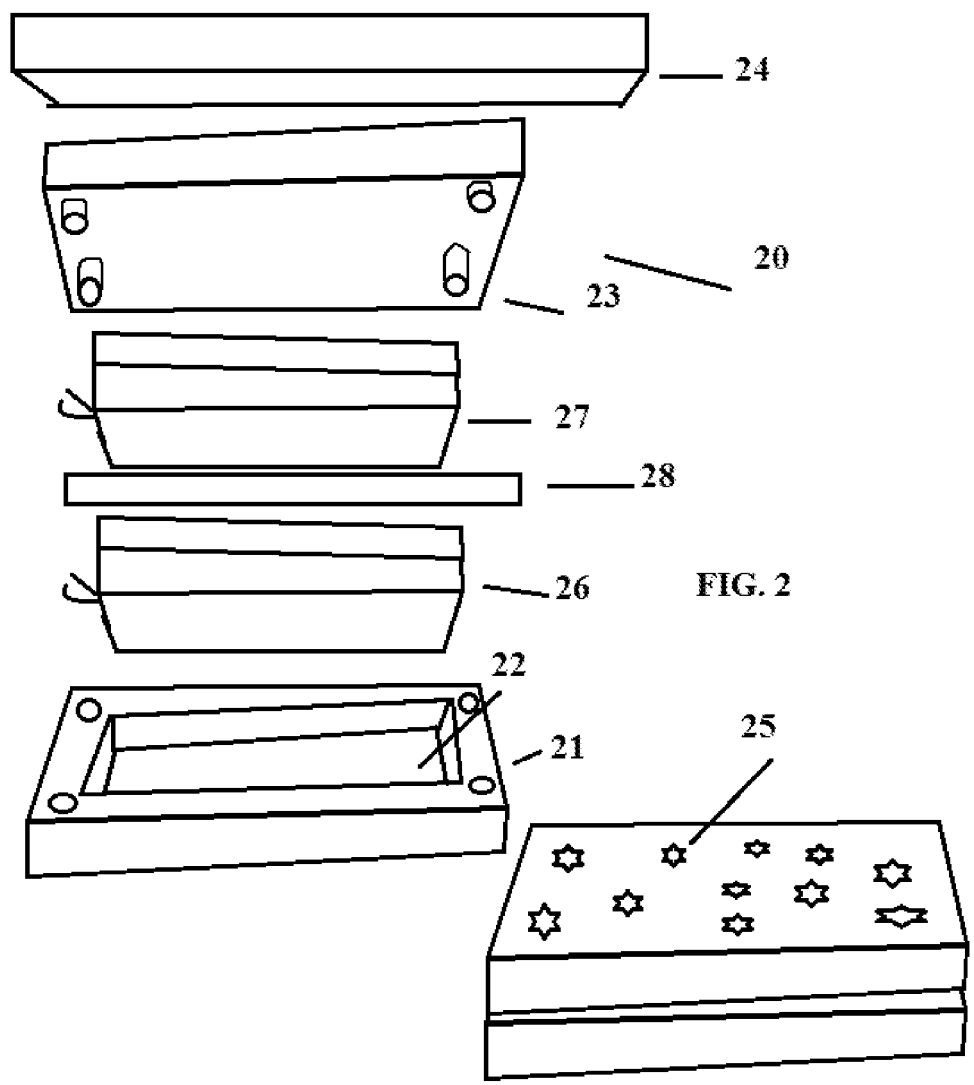
FIG. 2 features illustrations of one or more steps.

See FIG. 1. Provide a first tile 2 of any size, preferably one foot by one foot, made of any smooth, hard, insulating material, preferably ceramic or rubber. A first sheet of foil 1, made of any suitable conductive material, preferably aluminum, is placed on top of the first tile. Gold and copper sheets may also suffice. While any suitable technique of attaching or adhering 4 the tile to the foil are acceptable, the ideal is to provide as much contact area between the substrates while permitting a degree of vertical motion, perhaps 1 mm-cm, between them. Also, the smooth contour of the foil should be preserved. Accordingly, the use of double-sided tape 3, laid out in an "X" formation from corner to corner, serves as an exceedingly inexpensive, simple technique. Another technique involves the application of KAPTON tape, preferably 400 microns thick, to the outer edges.

Ideally, air bubbles between the first tile and first sheet of foil should be removed. This can be done by pressing out the air bubbles, although this must be done gently so as not to tear the first sheet of foil. Placing the first tile and first sheet of foil in a vacuum chamber or using a vacuum pump may be a superior technique because it does not apply a contact force. 2 CFM pumps are preferable, although 1 CFM pumps may also suffice. A reasonable vacuum time frame ranges from ten to fourty minutes, with thirty minutes being ideal, and pressed so as to remove any air bubbles. A 200-300 micron thick adhesive layer 4, preferably KAPTON Tape, a polyimide tape or any suitable insulating material having a tolerance for high temperatures, is placed along the edges of the first sheet of foil such that it forms a ⅓ inch border.

A first amount of polymer, preferably polydimethylsiloxane (PDMS), is cured with a curing agent in a ratio preferably between ten to one and five to one, mixed for ten minutes continuously, although longer mixing times may be appropriate if more than ten grams of polymer is used. A good rule of thumb is to continue mixing until the polymer resists mixing. The polymer is then set aside for five minutes or until it is clear, although setting it aside for a longer time, even up to an hour, will permit the polymer to more fully harden.

The cured polymer is placed into a vacuum chamber for at least forty five minutes, preferably an hour, up to two hours. Then the cured polymer 5 is added to the first sheet of foil using a pipette or similar instrument. The cured polymer is spread across the surface of the first sheet of foil 1 thoroughly, and in between the border made by the adhesive layer, such that the thickness of the polymer approximates the thickness of the adhesive layer. A rod or similar instrument, even a razor blade, may be helpful in both spreading the polymer and removing excess polymer, using the adhesive layer thickness as a guide.

Spreading the polymer onto the foil likely results in air bubbles 6 disposed between them. These air bubbles should be removed 7. For a less than four inches in width, the tile should be placed in a vacuum chamber for at least half an hour, although 45 minutes is ideal. For a tile of four to eight inches in width, the tile should be placed in a vacuum chamber for at least 45 minutes, although an hour is ideal. For a tile larger than eight inches, the minimum time spent in the vacuum chamber should be an hour and a half, although two hours is ideal.

After the air bubbles are substantially removed, the tile should be cooked 8 at 120 degrees for sixteen hours. It is left to cool for an hour at room temperature.

A second sheet of foil 9 is applied to a second tile 10, by means of an adhesive 11, as described above. Then a 1 cm by 1 cm square 12 is removed from the first amount of cured polymer on the first tile. A wire 13, preferably a single core magnetic wire, is connected to the exposed end of the first sheet foil, and insulated using any suitable adhesive material. An identical wire is then attached to the second sheet of foil on the second tile and again insulated using any suitable material.

In one embodiment, the device comprises a piezoelectric nano-generator or PENG. An exemplary fabrication of a large-scale PENG is similar to the exemplary fabrication of TENG, above, except instead of a layer of cured polymer, a layer of ZnO crystals is applied in the following manner:

ZnO crystals, preferably a half a gram to a gram, is mixed with deionized water, preferably a Liter, for at least five minutes or until the ZnO crystals are dissolved. A layer of ZnO, between one and one hundred microns thick, but preferably five microns, is applied 5 to the surface of the first sheet of foil 1, in a PVD setting. The first tile 3 is cooled for an hour, and then placed on the surface of the mixture of deionized water and dissolved ZnO crystals. The first tile should not be permitted to sink. The first tile and mixture should then be covered and sealed, and heated at 95 degrees C. for approximately 12 hours. Then the first tile should be washed with deionized water without it being submerged. Afterwards, the first tile should be left to cool for an hour under a hood. Then it should be heated at 100 degrees C. A layer of PMMA, preferably 50-100 microns thick, should be applied to the first sheet of foil. Again, a border of Kapton or polyimide tape provides a useful guide.

In one embodiment, one or more NGs 26 27 (TENGs and/or PENGs) can be utilized concurrently in the same device provided that they are adequately insulated from one another. Any suitable insulating material 28 will work, although a layer of rubber of a ¼ inch thickness is preferable. The one or more NGs can be placed in parallel or in series.

In one embodiment, the device comprises a Housing 20. An exemplary housing comprises a first article of durable material 21, such as plywood, cut to preferably one foot by one foot and possessing a half inch thickness. The first article of durable material comprises a recess 22 in the center, preferably eight inches by eight inches by a quarter of an inch, so as to receive either a TENG 26 and/or a PENG 27. A second article 23 of durable material is disposed on top so that the TENG or PENG is situated between the first and second article of durable material. A platform 24, or third article of durable material, preferably carpet, asphalt, or any such material appropriate for foot traffic, is placed on top of the second article of durable material opposite the first article of durable material. In one embodiment, the third article of durable material may be embedded with LEDs 25. In this embodiment, when a person steps on the third article of durable material, the LEDs light up.

Applicant claims:

1. A method of fabricating a triboelectric nanogenerator, comprising the steps of:
    a) providing a first tile and comprising one or more edges and a top side and a bottom side,
    b) attaching a first sheet of foil to the top side of the first tile with an adhesive material,
    c) removing air bubbles between the first tile and the first sheet of foil by means of a vacuuming,
    d) applying a 200-300 micron thick adhesive layer on the first sheet of foil along the one or more edges,
    e) applying a layer of polymer onto the first sheet of foil,
    f) removing air bubbles between the first sheet of foil and the layer of polymer by means of vacuuming,
    g) heating the first tile,
    h) providing a second tile comprising a top side and a bottom side,
    i) attaching a second sheet of foil upon the top side of the second tile with an adhesive material,
    j) removing an area of the layer of polymer and attaching a wire to that area, and
    k) attaching a wire to the second sheet of foil.

2. The method of claim 1, wherein the first tile has a width of between four inches and two feet and a length of between four inches and two feet.

3. The method of claim 1, wherein the adhesive material comprises at least two double sided adhesive strips, and the adhesive material is applied to the top side of the first tile in an "X" formation.

4. The method of claim 1, wherein the air bubbles are removed from between the first tile and the first sheet of foil by vacuuming using a 1-2 CFM vacuum pump between twenty and forty minutes.

5. The method of claim 1, wherein the layer of polymer comprises PDMS cured with a curing agent in a ratio of between five to one and ten to one.

6. The method of claim 1, wherein the first tile is heated at between 100 and 130 degrees for between ten and eighteen hours.

7. The method of claim 1, further comprising the step of placing a product produced by the method of claim 1 in a housing, wherein the housing comprises a first article, a second article, and a platform, wherein the first article comprises a recess in which the product is disposed and the platform is disposed on the second article.

8. The method of claim 7, further comprising the step of embedding LED lights in the platform.

* * * * *